US012577677B2

(12) United States Patent
Mehr et al.

(10) Patent No.: US 12,577,677 B2
(45) Date of Patent: Mar. 17, 2026

(54) ABRASION-RESISTANT COATINGS FOR HIGH-TEMPERATURE SUBSTRATES

(71) Applicant: Honeywell International Inc., Charlotte, NC (US)

(72) Inventors: Mehrad Mehr, Morristown, NJ (US); Bahram Jadidian, Watchung, NJ (US)

(73) Assignee: Honeywell International Inc., Charlotte, NC (US)

( * ) Notice: Subject to any disclaimer, the term of this patent is extended or adjusted under 35 U.S.C. 154(b) by 37 days.

(21) Appl. No.: 18/431,228

(22) Filed: Feb. 2, 2024

(65) Prior Publication Data

US 2025/0250678 A1 Aug. 7, 2025

(51) Int. Cl.
C23C 16/02 (2006.01)
C23C 16/32 (2006.01)
C23C 16/56 (2006.01)

(52) U.S. Cl.
CPC .......... C23C 16/56 (2013.01); C23C 16/0254 (2013.01); C23C 16/325 (2013.01)

(58) Field of Classification Search
CPC ... C23C 16/325; C23C 16/0254; C23C 16/56; C23C 16/401
See application file for complete search history.

(56) References Cited

U.S. PATENT DOCUMENTS 3,925,577 A * 12/1975 Fatzer .................. C23C 16/325
427/253
4,962,070 A 10/1990 Sullivan 5,332,601 A * 7/1994 Varacalle, Jr. .......... C04B 41/87
427/452
5,750,450 A 5/1998 Bull et al.
7,252,860 B2 8/2007 Peetz et al.
7,335,397 B2 2/2008 Rudolph et al.
9,463,489 B2 10/2016 Allemand et al.
9,493,873 B2 11/2016 Allemand et al.
10,894,382 B2 1/2021 McManus et al.
2016/0240419 A1* 8/2016 Sieber ............... C23C 16/45576
2020/0040449 A1 2/2020 Fischer, III et al.
2023/0271150 A1* 8/2023 Yates ......................... B01J 3/04
423/650

FOREIGN PATENT DOCUMENTS

CN 206815759 * 12/2017 .............. E04F 15/21
GB 2542788 * 4/2017 .............. G01L 19/14
JP 2021-21098 * 2/2021 .............. C23C 14/06
(Continued)

OTHER PUBLICATIONS

Mohammad, F Z, et al., "Development and Characterization of Silicon Carbide Coating on Graphite Substrate". J Chem Edu Res Prac, 2022, vol. 6, Issue 2, 258-266.*

(Continued)

*Primary Examiner* — Bret P Chen
(74) *Attorney, Agent, or Firm* — Shumaker & Sieffert, P.A.

(57) ABSTRACT

A method includes forming an abrasion-resistant coating on a substrate including graphite, and grinding the coating to a predetermined flatness index and a predetermined roughness index. An assembly includes the substrate including graphite, and the abrasion-resistant coating formed on the substrate. The assembly may be configured to operate at elevated temperatures.

11 Claims, 5 Drawing Sheets

(56)         References Cited

FOREIGN PATENT DOCUMENTS

| | | | | |
|---|---|---|---|---|
| KR | 10-2017-0121587 | * | 11/2017 | ............. C23C 16/34 |
| WO | WO 2006/049794 A2 | * | 5/2006 | |
| WO | WO 2014/161704 | * | 10/2014 | ............... F16J 15/34 |
| WO | WO 2015/093550 | * | 6/2015 | ............. H01L 21/02 |

OTHER PUBLICATIONS

Huo, Yanli, et al., "Preparation and Characterization of SiC Coating on Graphite Substrate". Key Engineering Materials, 2014, vols. 602-603, pp. 412-415.*

Nakamura, Daisuke, et al., "Sintered tantalum carbide coatings on graphite substrates: Highly reliable protective coatings for bulk and epitaxial growth". Applied Physics Letters 106, 082108 (2015), pp. 1-5.*

Wu, Linmin, et al., "Abrasive Resistant Coatings—A Review". Lubricants 2014, 2, 66-89.*

* cited by examiner

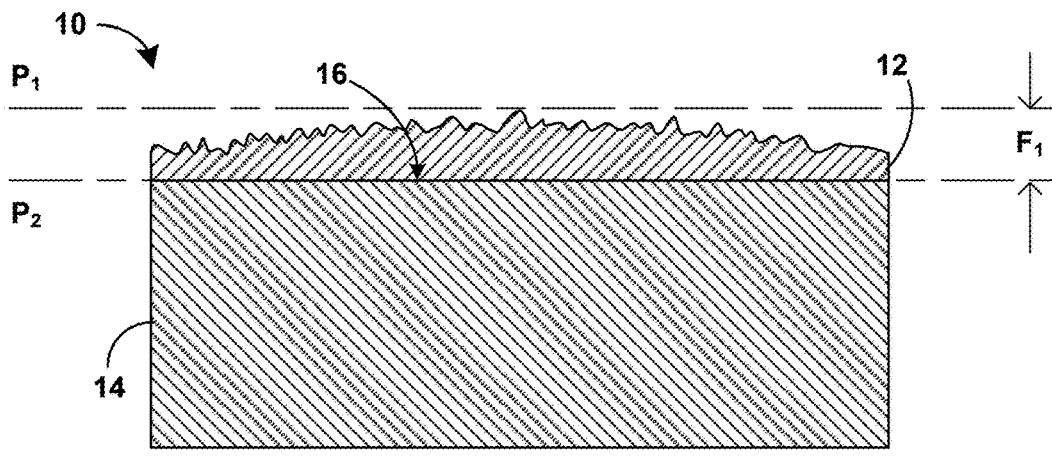
FIG. 1A
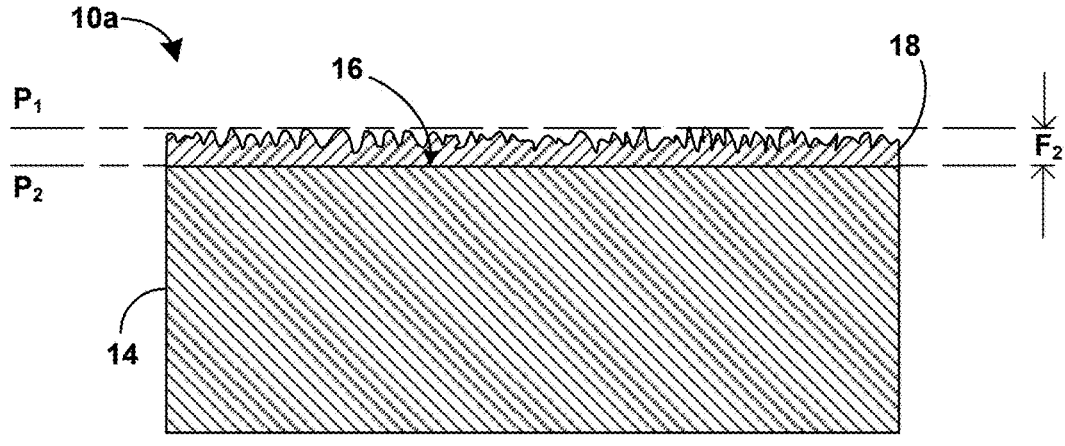
FIG. 1B
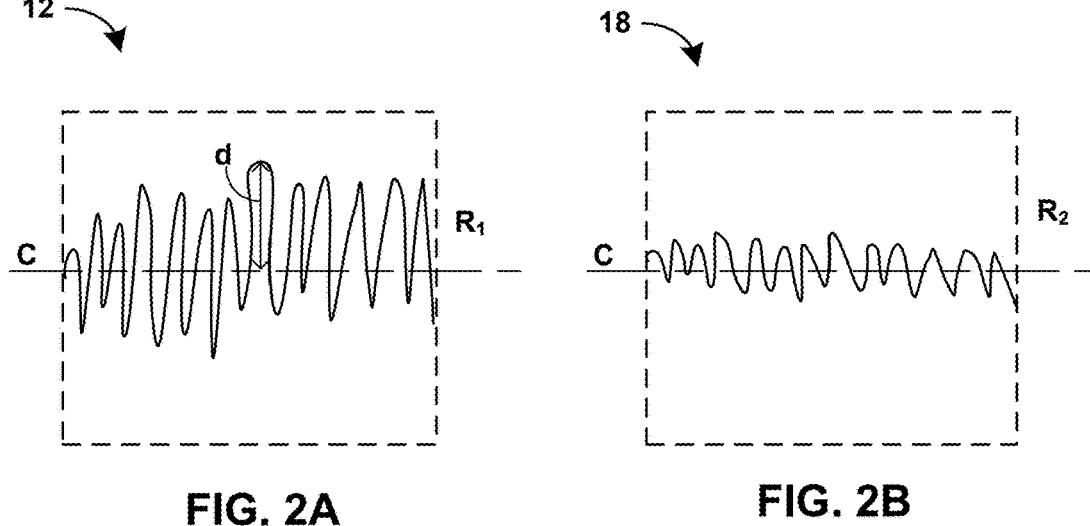
FIG. 2A                              FIG. 2B

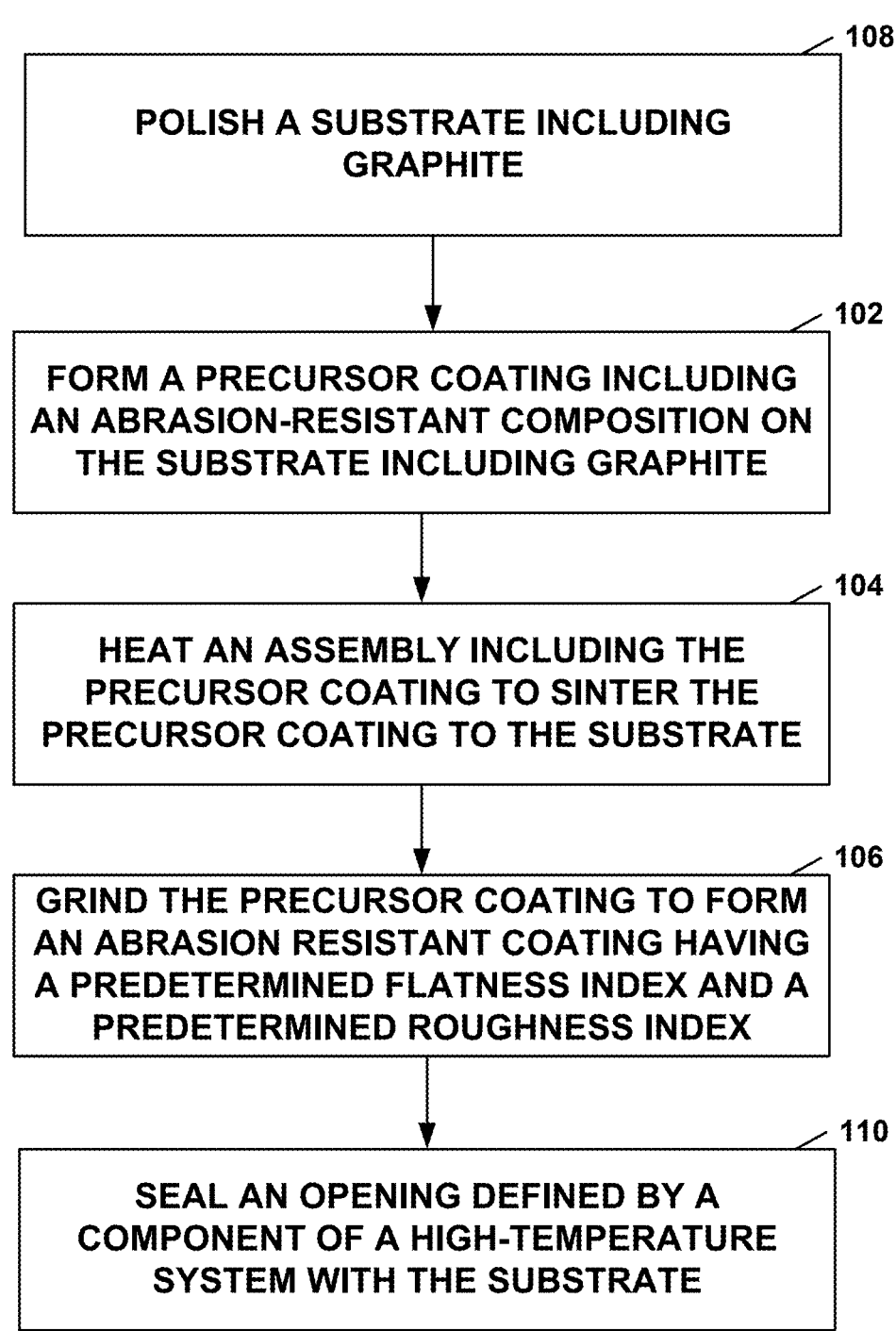

108

POLISH A SUBSTRATE INCLUDING GRAPHITE

102

FORM A PRECURSOR COATING INCLUDING AN ABRASION-RESISTANT COMPOSITION ON THE SUBSTRATE INCLUDING GRAPHITE

104

HEAT AN ASSEMBLY INCLUDING THE PRECURSOR COATING TO SINTER THE PRECURSOR COATING TO THE SUBSTRATE

106

GRIND THE PRECURSOR COATING TO FORM AN ABRASION RESISTANT COATING HAVING A PREDETERMINED FLATNESS INDEX AND A PREDETERMINED ROUGHNESS INDEX

110

SEAL AN OPENING DEFINED BY A COMPONENT OF A HIGH-TEMPERATURE SYSTEM WITH THE SUBSTRATE

FIG. 4

ABRASION-RESISTANT COATINGS FOR HIGH-TEMPERATURE SUBSTRATES

STATEMENT REGARDING FEDERALLY SPONSORED RESEARCH OR DEVELOPMENT

This invention was made with Government support under 80MSFC21CA010 awarded by NASA. The Government has certain rights in the invention.

TECHNICAL FIELD

The present disclosure relates to abrasion-resistant coatings for high-temperature substrates.

BACKGROUND

High-temperature systems may include components exposed to abrasive conditions. For example, a component may be in contact with another component, a substrate or a stream, or a housing of a system, or otherwise face a potentially abrasive environment. Certain components may be susceptible to abrasion from contact, and may exhibit dimensional changes beyond acceptable operating tolerances in response to abrasion. Thermal cycling may further increase susceptibility to abrasion, for example, by dimensional changes leading to abrasive contact of a surface with a neighboring surface.

SUMMARY

In general, the disclosure describes abrasion-resistant coatings for high-temperature substrates and techniques for forming abrasion-resistant coatings.

In some examples, an example method includes forming a precursor coating including an abrasion-resistant composition on a substrate including graphite. The method may further include grinding the precursor coating to form an abrasion-resistant coating having a predetermined flatness index and a predetermined roughness index.

In some examples, an assembly includes a substrate including graphite, and an abrasion-resistant coating formed on the substrate. The abrasion-resistant coating may have a predetermined flatness index and a predetermined roughness index.

The details of one or more examples are set forth in the accompanying drawings and the description below. Other features, objects, and advantages will be apparent from the description and drawings, and from the claims.

BRIEF DESCRIPTION OF THE FIGURES

The details of one or more examples are set forth in the accompanying drawings and the description below. Other features, objects, and advantages will be apparent from the description and drawings, and from the claims.

FIG. 1A is a partial cross-sectional view of an example assembly including a precursor coating on a substrate including graphite.

FIG. 1B is a partial cross-sectional view of the assembly of FIG. 1 in another configuration after grinding the precursor coating to an abrasion-resistant coating having a predetermined flatness.

FIG. 2A is a partial cross-sectional view of the precursor coating of FIG. 1A having a first roughness.

FIG. 2B is a partial cross-sectional view of the abrasion-resistant coating of FIG. 1B having a second roughness less than the first roughness.

FIG. 4 is a flowchart representing an example technique for forming an abrasion-resistant coating on a substrate.

DETAILED DESCRIPTION

Figure 3:
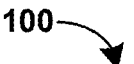
FIG. 3 is a cross-sectional view of an example high-temperature system including the assembly of FIG. 1B.

In general, the disclosure describes abrasion-resistant coatings for high-temperature substrates and techniques for forming abrasion-resistant coatings. A component used in a high-temperature system or assembly (for example, a reactor operating at temperatures of 1000° C. or more) may include a gasket-less seal. For example, the seal may include graphite, which can sustain elevated temperatures, be formed into predetermined shapes, and provide a sealing surface. The sealing surface may be polished and relatively flat. In course of operation, the sealing surface defined by a graphite matrix may wear, and become scratched and damaged.

A substrate including graphite may be coated to promote durability and operational life of the substrate. In some examples, an example method includes forming a precursor coating including an abrasion-resistant composition on a substrate including graphite. The precursor coating (e.g., formed by depositing an abrasion-resistant composition on the substrate) may not initially conform to a flatness tolerance or a roughness tolerance. The method may further include grinding the precursor coating to form an abrasion-resistant coating having a predetermined flatness index and a predetermined roughness index. The grinding may promote achieving flatness and roughness of the coating, conforming to predetermined tolerances. Further, applying the precursor coating to the substrate may accommodate deviations in roughness or flatness of the substrate, and the grinding may provide an overall roughness and flatness of the coated substrate that conforms to predetermined tolerances.

In some examples, an assembly includes a substrate including graphite, and an abrasion-resistant coating formed on the substrate. For example, the substrate may form a seal. The abrasion-resistant coating may have a predetermined flatness index and a predetermined roughness index. Thus, the substrate may exhibit a flatness and a roughness conforming to predetermined tolerances, which may facilitate sealing the substrate against another component.

FIG. 1A is a partial cross-sectional view of an example assembly 10 including a precursor coating 12 on a substrate 14 including graphite. For example, substrate 14 may be a seal for a high-temperature system or assembly. In some examples, substrate 14 is a seal for a high-temperature reactor, for example, a reactor having an operating temperature of at least 1000° C. In some examples, substrate 14 defines a flat gasket-less seal. The reactor may be a methane pyrolysis reactor.

Precursor coating 12 may include any suitable abrasion-resistant composition, for example, an abrasion-resistant composition that can be machined or ground. The abrasion-resistant composition has a hardness that is greater than that of graphite. For example, precursor coating 12 may have a hardness of greater than 2 on the Mohs scale.

Precursor coating 12 is ground to form an abrasion-resistant coating, as described with respect to FIG. 1B. The composition of precursor coating 12 and the abrasion-resistant coating formed by grinding remains the same, while only differing in geometrical aspects. In some examples, precursor coating 12 includes a ceramic. In some examples, precursor coating 12 includes a rare-earth disilicate or silicon carbide.

Precursor coating 12 may be formed or deposited on substrate 14 using any suitable technique. For example, precursor coating 12 may be formed or deposited on substrate 14 by slurry coating, dip-coating, brush-coating, spray-coating, or vapor deposition. In some examples, precursor coating 12 may be dried, heated, sintered or cured during or after deposition. Precursor coating 12 may include chemical vapor deposited (CVD) silicon carbide.

Substrate 14 may define a polished interface 16 facing the abrasion-resistant coating. For example, substrate 14 may be one or more of machined, ground, or polished to form polished interface 16 prior to forming precursor coating 12 on substrate 14. Polished interface 16 may promote relatively uniform deposition of precursor coating 12 on substrate 14.

In the initial configuration of assembly 10 shown in FIG. 1A, precursor coating 12 may have a flatness index $F_1$. The flatness index is the separation between two planes $P_1$ and $P_2$. Plane $P_1$ passes through a portion of precursor coating 12 that is distal-most away from substrate 14 (for example, the portion being at a maximum distance from substrate 14 compared to other portions of precursor coating 12). Plane $P_2$ passes through a portion of precursor coating 12 that is proximal-most to substrate 14 (for example, the portion being at a minimum distance from substrate 14 compared to other portions of precursor coating 12). The flatness index is measured along an entire area of precursor coating 12. A flatness index having a relatively low magnitude is indicative of a relatively high flatness. For example, a flatness index of less than 1 $mm/m^2$ indicates a separation between the distal-most and proximal-most portions of less than 1 mm along an area of 1 $m^2$. Precursor coating 12 formed by deposition of abrasion-resistant composition on substrate 14 may initially have a low flatness associated with a relatively high flatness index, for example, of greater than 1 $mm/m^2$, greater than 2 $mm/m^2$, greater than 5 $mm/m^2$, greater than 10 $mm/m^2$, or greater than 20 $mm/m^2$. Thus, precursor coating 12 may be ground to increase the flatness (reduce the flatness index).

FIG. 1B is a partial cross-sectional view of the assembly of FIG. 1 in another configuration 10a after grinding precursor coating 12 to form an abrasion-resistant coating 18 having a predetermined flatness index $F_2$. As seen in FIG. 1B, the separation between plane $P_1$ and plane $P_2$ is reduced by grinding, which may remove material from an outer portion of precursor coating 12 (distally away from substrate 14). Abrasion-resistant coating 18 may have any predetermined flatness index. For example, $F_2$ may be less than 10 $mm/m^2$, less than 5 $mm/m^2$, less than 2 $mm/m^2$, or less than 1

$mm/m^2$. While a flatness index has been described, any suitable measure of flatness may be used, for example, according to ASTM A1030.

As described with reference to FIGS. 2A and 2B, the roughness of precursor coating 12 is also affected by the grinding. The roughness index and the flatness index of a surface are independent from each other. For example, the surface may be substantially flat (flatness index of less than 1 $mm/m^2$ or even close to 0 $mm/m^2$), yet exhibit roughness. Further, two surfaces may have substantially similar or identical flatness indices (for example, within 10% of each other), but differ in roughness (for example, differing by more than 10%), or vice versa.

FIG. 2A is a partial cross-sectional view of precursor coating 12 of FIG. 1A having a first roughness index $R_1$. The roughness index of a surface is determined as an average distance (d) of all peaks and valleys away from a centerline extending along a portion of a geometric centerline (C) of the surface. Any suitable sampling length may be used. A relatively higher roughness index is indicative of a relatively higher roughness. The roughness index may be determined using any suitable procedure, for example, according to ASTM D7127. While a particular roughness index has been described, any other measure of roughness may be used, for example, a count of peak/valley pairs per unit length.

FIG. 2B is a partial cross-sectional view of abrasion-resistant coating 18 of FIG. 1B having a second roughness index $R_2$ less than the first roughness index $R_1$. Thus, abrasion-resistant coating 18 may have a predetermined flatness index (e.g., $F_2$) and a predetermined roughness index (e.g., $R_2$). In some examples, the predetermined roughness index is less than 1 mm, less than 100 μm, or less than 10 μm.

FIG. 3 is a cross-sectional view of an example high-temperature system 100 including assembly 10a of FIG. 1B. System 100 includes a pyrolysis reactor 102. In pyrolysis reactor 102, assembly 10a forms a seal within a furnace chamber 104, which can be opened and closed to introduce and remove material into and from furnace chamber 104. Thus, assembly 10a may seal an opening defined by a component of system 100. Abrasion-resistant coating 18 of assembly 10a resists wear and degradation of substrate 14 including graphite, and promotes adequate sealing within system 100.

FIG. 4 is a flowchart representing an example technique for forming an abrasion-resistant coating on a substrate. The technique of FIG. 4 is described, as an example, with reference to assemblies 10 and 10a of FIGS. 1A and 1B. However, the technique of FIG. 4 may be used to form any assembly according to the present disclosure. Further, while the technique of FIG. 4 may be used to form assembly 10a, any suitable technique may be used to form assembly 10a.

In some examples, the technique includes forming precursor coating 12 including an abrasion-resistant composition on substrate 14 including graphite (102). Any suitable technique may be used to form precursor coating 12. For example, the forming (102) of precursor coating 12 may include physical vapor deposition or chemical vapor deposition. In some examples, the forming (102) includes chemical vapor deposition of silicon carbide.

The method may further include grinding precursor coating 12 to form abrasion-resistant coating 18 having a predetermined flatness index and a predetermined roughness index (106). Precursor coating 12, and thus abrasion-resistant coating 18 formed from precursor coating 18, may include a rare-earth disilicate or silicon carbide.

The grinding (106) may include contacting precursor coating 12 with a sanding composition, a sanding belt, a sander, a grinder, a rotating grinder, a reciprocating grinder, or vibrating grinder. The grinding (106) may include pausing the contact, measuring one or both of a flatness index or the roughness index, and resuming the contact in response to determining that one or both of the flatness index or the roughness index do not conform to predetermined tolerances.

In some examples, the grinding (106) includes subjecting precursor coating 12 to a first grinding phase to bring the flatness index within a predetermined flatness tolerance, and to a second grinding phase to bring the roughness index within a predetermined roughness tolerance. In some examples, the first grinding phase and second grinding phase may be alternated or repeated until one or both of flatness or roughness tolerances are achieved. For example, the predetermined flatness index may be less than 10 mm/m², and the grinding (106) is continued at least until such a flatness index is achieved. In some examples, the predetermined roughness index is less than 100 μm/m, and the grinding (106) is continued at least until such a roughness index is achieved.

In some examples, the grinding (106) includes a single simultaneous grinding phase that achieves both flatness and roughness within predetermined tolerances. The grinding (106) may include polishing abrasion-resistant coating 18. For example, the second grinding phase (or another grinding phase) may include the polishing.

In some examples, the technique further includes heating, prior to the grinding (106), assembly 10 including precursor coating 12 on substrate 14 to sinter precursor coating 12 to substrate 14 (104). The heating (104) may include heating assembly 10 to elevate the temperature of precursor coating 12 to at least 300° C., at least 400° C., at least 500° C., or at least 600° C.

In some examples, the technique further includes, prior to the forming (102) of precursor coating 12, polishing substrate 14 (108). For example, substrate 14 may be polished to a predetermined roughness. In some examples, substrate 14 may be ground or a predetermined flatness and/or roughness.

In some examples, abrasion-resistant coating 18 (and precursor coating 12) has a hardness that is greater than that of graphite. Thus, abrasion-resistant coating 18 may resist wear or deformation of substrate 14 including graphite.

As described with reference to FIG. 3, substrate 14 may be or form a seal for a high-temperature system. Thus, the technique may further include sealing an opening defined by a component of the high-temperature system with the seal, or with assembly 10a (110). The component may include a reactor (e.g., reactor 102). The reactor may be a methane pyrolysis reactor.

EXAMPLES

Example 1

Figure 5A:
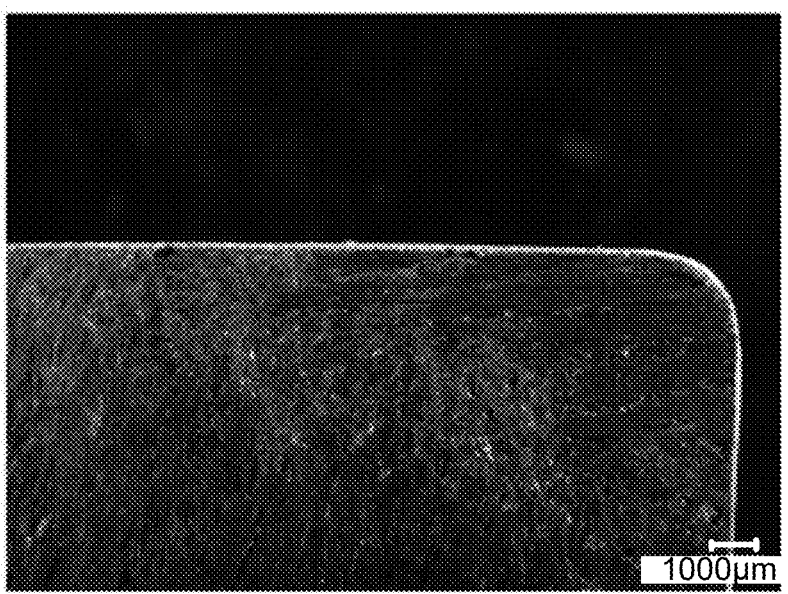
FIG. 5A is a photograph showing a cross-section of an example of an assembly including an abrasion-resistant coating including a rare earth disilicate on a substrate including graphite.
Figure 5B:
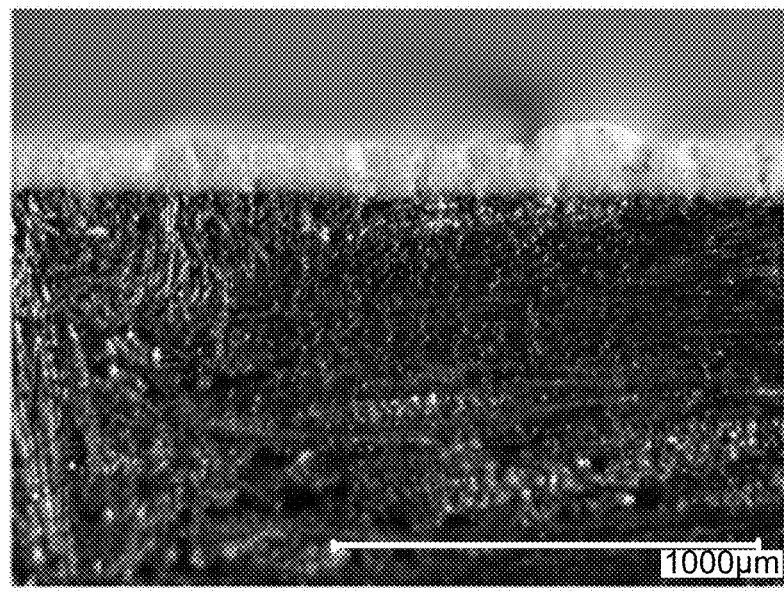
FIG. 5B is a photograph showing a magnified cross-section of a portion of the assembly of FIG. 5A.

FIG. 5A is a photograph showing a cross-section of an example of an assembly including an abrasion-resistant coating including a rare earth disilicate on a substrate including graphite. FIG. 5B is a photograph showing a magnified cross-section of a portion of the assembly of FIG. 5A.

The assembly was made by coating the substrate with a layer of silicon carbide. A thick layer of rare earth disilicate was applied using a slurry or paste. The assembly was heat treated.

Figure 6:
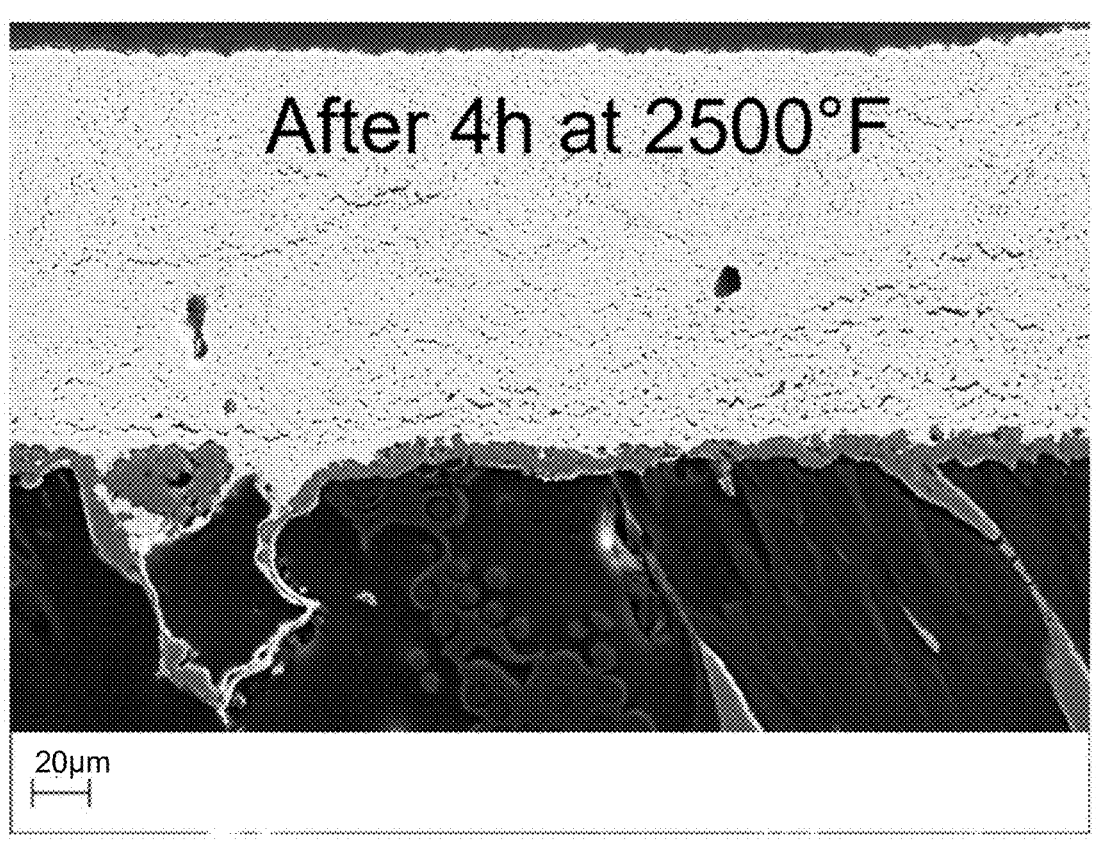
FIG. 6 is a photograph showing a magnified cross-section of a portion of the assembly of FIG. 5A after thermal treatment.

FIG. 6 is a photograph showing a magnified cross-section of a portion of the assembly of FIG. 5A after thermal treatment.

Example 2

Figure 7:
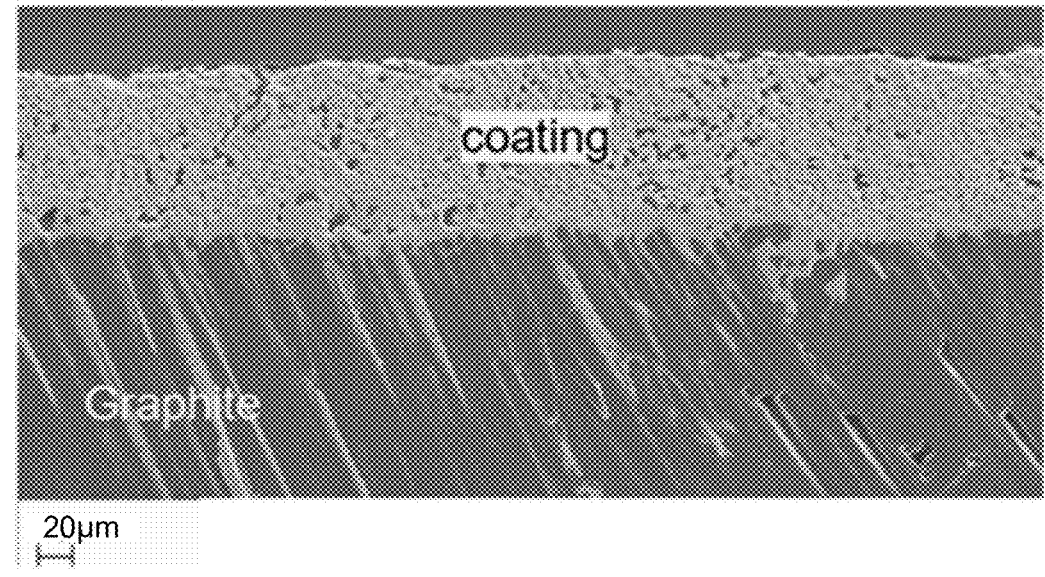
FIG. 7 is a photograph showing a cross-section of an example of an assembly including an abrasion-resistant coating including silicon carbide on a substrate including graphite.

FIG. 7 is a photograph showing a cross-section of an example of an assembly including an abrasion-resistant coating including silicon carbide on a substrate including graphite. The substrate was coated with silicon carbide. A slurry of silicon carbide with a mixture of preceramic polymers was applied and heat treated to form a thick silicon carbide coating.

The following clauses illustrate example subject matter described herein.

Clause 1: A method including: forming a precursor coating including an abrasion-resistant composition on a substrate including graphite; and grinding the precursor coating to form an abrasion-resistant coating having a predetermined flatness index and a predetermined roughness index.

Clause 2: The method of clause 1, where the abrasion-resistant coating includes a rare-earth disilicate or silicon carbide.

Clause 3: The method of clauses 1 or 2, further including heating, prior to the grinding, an assembly including the precursor coating on the substrate to sinter the precursor coating to the substrate.

Clause 4: The method of any of clauses 1 to 3, where forming the precursor coating includes chemical vapor deposition of silicon carbide.

Clause 5: The method of any of clauses 1 to 4, further including, before forming the precursor coating, polishing the substrate.

Clause 6: The method of any of clauses 1 to 5, where the grinding includes polishing the precursor coating.

Clause 7: The method of any of clauses 1 to 6, where the abrasion-resistant coating has a hardness that is greater than that of graphite.

Clause 8: The method of any of clauses 1 to 7, where the predetermined flatness index is less than 10 mm/m².

Clause 9: The method of any of clauses 1 to 8, where the predetermined roughness index is less than 100 μm.

Clause 10: The method of any of clauses 1 to 9, where the substrate is a flat gasket-less seal for a high-temperature system.

Clause 11: The method of clause 10, further including sealing an opening defined by a component of the high temperature system with the seal.

Clause 12: The method of clause 11, where the component includes a reactor.

Clause 13: The method of clause 12, where the reactor is a methane pyrolysis reactor.

Clause 14: An assembly including: a substrate including graphite; and an abrasion-resistant coating formed on the substrate, where the abrasion-resistant coating has a predetermined flatness index and a predetermined roughness index.

Clause 15: The assembly of clause 14, where the abrasion-resistant coating includes a rare-earth disilicate or silicon carbide.

Clause 16: The assembly of clause 15, where the abrasion-resistant coating includes chemical vapor deposited silicon carbide.

Clause 17: The assembly of any of clauses 14 to 16, where the substrate defines a polished interface facing the abrasion-resistant coating.

Clause 18: The assembly of any of clauses 14 to 17, where the abrasion-resistant coating has a hardness that is greater than that of graphite.

Clause 19: The assembly of any of clauses 14 to 8, where the predetermined flatness index is less than 10 mm/m².

Clause 20: The assembly of clause 14, where the predetermined roughness index is less than 100 μm.

Various examples have been described. These and other examples are within the scope of the following claims.

What is claimed is:

1. A method comprising:

forming a precursor coating comprising an abrasion-resistant composition on a substrate comprising graphite; and grinding the precursor coating to form an abrasion-resistant coating having a predetermined flatness index of less than less than 10 mm/m² and a predetermined roughness index of less than 100 μm.

2. The method of claim 1, wherein the abrasion-resistant coating comprises a rare-earth disilicate or silicon carbide.

3. The method of claim 1, further comprising heating, prior to the grinding, an assembly comprising the precursor coating on the substrate to sinter the coating to the substrate.

4. The method of claim 1, wherein forming the precursor coating comprises chemical vapor deposition of silicon carbide.

5. The method of claim 1, further comprising, before forming the abrasion-resistant coating, polishing the substrate.

6. The method of claim 1, wherein the grinding comprises polishing the abrasion-resistant coating.

7. The method of claim 1, wherein the abrasion-resistant coating has a hardness that is greater than that of graphite.

8. The method of claim 1, wherein the substrate is a flat gasket-less seal.

9. The method of claim 8, further comprising sealing an opening defined by a component with the seal.

10. The method of claim 9, wherein the component comprises a reactor.

11. The method of claim 10, wherein the reactor is a methane pyrolysis reactor.

* * * * *